US008286853B2

(12) United States Patent
Akiyama et al.

(10) Patent No.: US 8,286,853 B2
(45) Date of Patent: Oct. 16, 2012

(54) BONDING APPARATUS AND BONDING METHOD

(75) Inventors: Naoki Akiyama, Nirasaki (JP); Masahiko Sugiyama, Nirasaki (JP); Michikazu Nakamura, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/275,843

(22) Filed: Oct. 18, 2011

(65) Prior Publication Data

US 2012/0091187 A1    Apr. 19, 2012

(30) Foreign Application Priority Data

Oct. 18, 2010  (JP) ................................. 2010-233874

(51) Int. Cl.
*B23K 31/02* (2006.01)
*B23K 37/04* (2006.01)
(52) U.S. Cl. ........ 228/180.21; 228/43; 228/46; 228/227
(58) Field of Classification Search .................... None
See application file for complete search history.

(56) References Cited

U.S. PATENT DOCUMENTS

| 5,297,480 | A | * | 3/1994 | Miyashita et al. .............. 100/90 |
| 5,370,301 | A | * | 12/1994 | Belcher et al. ........... 228/180.22 |
| 5,632,434 | A | * | 5/1997 | Evans et al. ................... 228/44.7 |
| 5,632,435 | A | * | 5/1997 | Schmied et al. .............. 228/121 |
| 6,059,170 | A | * | 5/2000 | Jimarez et al. ................ 228/119 |
| 6,702,173 | B2 | * | 3/2004 | Murakami ....................... 228/39 |
| 2004/0159401 | A1 | * | 8/2004 | Miya et al. ............... 156/345.24 |
| 2004/0244384 | A1 | * | 12/2004 | Yamazaki ........................ 62/3.2 |
| 2005/0051520 | A1 | * | 3/2005 | Tanaka ..................... 219/121.43 |
| 2007/0095289 | A1 | * | 5/2007 | Arami ........................... 118/725 |
| 2007/0170227 | A1 | * | 7/2007 | Ohno et al. .................... 228/101 |
| 2009/0184152 | A1 | * | 7/2009 | Kimbara ....................... 228/111 |
| 2009/0200269 | A1 | * | 8/2009 | Kadkhodayan et al. ......... 216/71 |
| 2010/0039747 | A1 | * | 2/2010 | Sansoni et al. ................ 361/234 |
| 2010/0317197 | A1 | * | 12/2010 | Lind et al. ..................... 438/758 |
| 2011/0011919 | A1 | * | 1/2011 | Yoshimoto et al. ........... 228/102 |
| 2012/0028057 | A1 | * | 2/2012 | Aihara et al. ................. 428/457 |

FOREIGN PATENT DOCUMENTS

| JP | 2004-207436 A | 7/2004 |
| JP | 2007-158200 A | 6/2007 |
| JP | 2009-049051 A | 3/2009 |

* cited by examiner

*Primary Examiner* — Kiley Stoner
(74) *Attorney, Agent, or Firm* — Nath, Goldberg & Meyer; Jerald L. Meyer

(57) ABSTRACT

A bonding apparatus includes a thermal treating unit and a bonding unit that are integrally bonded together. The thermal treating unit includes a first thermal treating plate for supporting and thermally processing a superimposed substrate. The bonding unit includes a second thermal treating plate for supporting and thermally processing the superimposed substrate processed in thermal treating unit, and a pressing mechanism for pressing the superimposed substrate against the second thermal treating plate. The first thermal treating plate includes a cooling mechanism for cooling the superimposed substrate placed on the first heating plate. Each unit can depressurize the internal atmosphere to a specified degree of vacuum. The thermal treating unit has a plurality of carrying mechanisms for conveying the wafers between the two units.

4 Claims, 14 Drawing Sheets

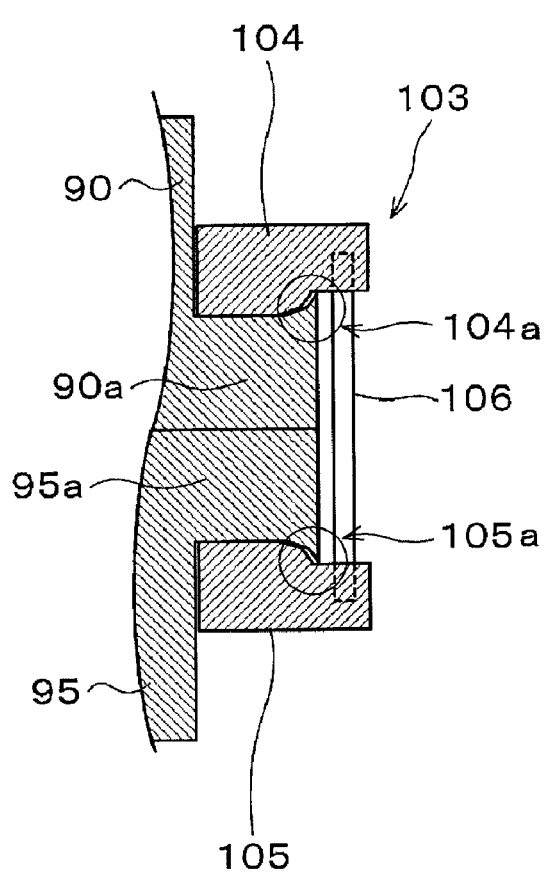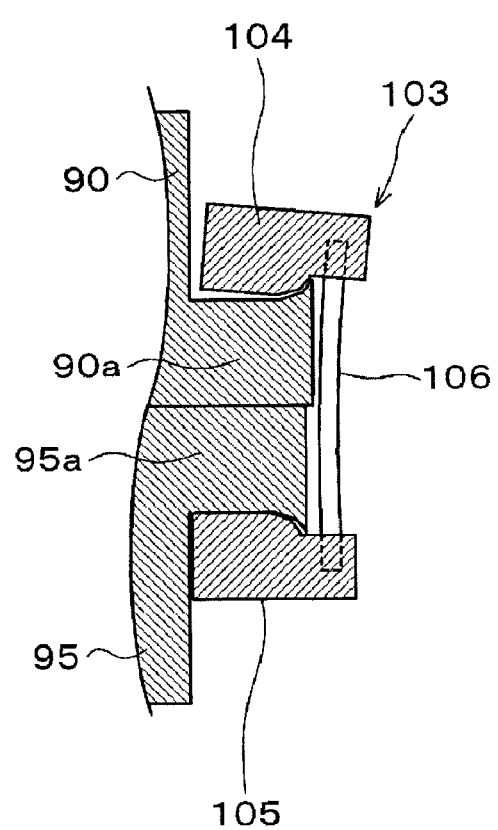

BONDING APPARATUS AND BONDING METHOD

CROSS-REFERENCE TO RELATED APPLICATION

This application claims the benefit of Japanese Patent Application No. 2010-233874, filed on Oct. 18, 2010, in the Japanese Patent Office, the disclosure of which is incorporated herein in its entirety by reference.

TECHNICAL FIELD

The present disclosure relates to a bonding apparatus and method for pressing and bonding substrates having metallic bonding portions

BACKGROUND

In recent years, high integration of semiconductor devices (hereinafter, referred to as "devices") has been promoted. Meanwhile, when a plurality of highly-integrated devices is connected by wires for production, a problem occurs because of an increase in wire length and hence increase in wire resistance and wire delay.

To overcome this problem, a three dimensional integration technique has been proposed which stacks semiconductor devices in three dimensions. In the three dimensional integration technique, for example, a bonding apparatus is used to bond two semiconductor wafers (hereinafter, referred to as "wafers") together. The boding apparatus includes, for example, a fixed table on which the wafers are mounted, and a movable table which faces the fixed table and can be elevated with a wafer absorbed on its bottom side. The fixed table and the movable table contain respective heaters. In the bonding apparatus, the two wafers are overlapped with each other and then are bonded together by being pressurized by weight of the fixed table and the movable table while being heated by the heaters.

However, when two wafers are bonded together, there may be a case where bonding portions of metal formed on surfaces of the wafers are bonded together. In this case, there is a need to pressurize the metal bonding portions while heating them to a predetermined high temperature. In other words, there is a need to sequentially perform a pre-heating step of heating the wafers to a predetermined temperature, a bonding step of pressurizing them with the predetermined temperature maintained, and a post-heating step of cooling them.

However, the use of a conventional bonding apparatus in this case requires a vast amount of time in bonding the two wafers together.

Above all, it is time-consuming to heat the wafers to the specified temperature in the pre-heating step because the specified temperature is high. Moreover, since the predetermined temperature is high, it takes time to cool the hot wafers in the post-heating step. Further, when the metal bonding portions are alloyed and bonded together, if the wafers are rapidly cooled, there is a need to cool the wafers below a predetermined rate of cooling since the strength and physical property of the metal bonding portions may be changed. Moreover, the time taken for the bonding step cannot be shortened since it depends on the material or the like used in the metal bonding portions.

The vast amount of time required in bonding the wafers having metal bonding portions leads to a reduction in the throughput of wafer bonding processing.

The present disclosure is to address the problem above. The object of the present disclosure is to bond the wafers to each other more efficiently and to improve the output of the wafer bonding processing.

SUMMARY

One embodiment of the present disclosure provides a bonding apparatus for bonding individual substrates having metallic bonding portions, which includes: a thermal treating unit including a first thermal treating plate configured to support and thermally process a superimposed substrate obtained by superimposing the individual substrates with the bonding portions thereof kept in contact with each other and a first depressurizing mechanism configured to depressurize the atmosphere within the thermal treating unit to a specified degree of vacuum; and a bonding unit including a second thermal treating plate configured to support and thermally process the superimposed substrate processed in the thermal treating unit, a pressing mechanism configured to press the superimposed substrate against the second heating plate, and a second depressurizing mechanism configured to depressurize the atmosphere within the bonding unit to a specified degree of vacuum, wherein the thermal treating unit is airtightly connected to the bonding unit, and the first thermal treating plate includes a cooling mechanism configured to cool the superimposed substrate placed on the first heating plate.

With the present disclosure, it is possible to process the superimposed substrates one after another in the thermal treating unit and the bonding unit. That is, the superimposed substrate is first placed on the first thermal treating plate and heated in the thermal treating unit. Within the bonding unit in which the atmosphere is kept at a specified degree of vacuum, the superimposed substrate is placed on the second heating plate. While keeping the superimposed substrate at a specified temperature, the superimposed substrate is pressed against the second thermal treating plate and is bonded together. Thereafter, the superimposed substrate is placed on the first thermal treating plate and is cooled in the thermal treating unit. It is therefore possible to parallel process another superimposed substrate in the thermal treating unit while one superimposed substrate is processed in the bonding unit. With the present disclosure, even if the specified temperature is high, two superimposed substrates can be efficiently processed at the same time because the thermal treating unit and the bonding unit are provided independently of each other. Accordingly, it is possible to increase the throughput of the substrate bonding process.

The thermal treating unit may include a plurality of carrying mechanisms configured to convey the superimposed substrate between the thermal treating unit and the bonding unit.

The bonding unit may include a cooling mechanism configured to cool the superimposed substrate placed on the second heating plate.

Another embodiment of the present disclosure provides a bonding method for bonding individual substrates having metallic bonding portions. The method includes placing a superimposed substrate on a first thermal treating plate in a thermal treating unit and heating the superimposed substrate to a first temperature, wherein the superimposed substrate is obtained by superimposing the individual substrates with the bonding portions thereof kept in contact with each other;

placing the superimposed substrate on a second thermal treating plate in a bonding unit in which the atmosphere is depressurized to a specified degree of vacuum, and bonding the superimposed substrate by pressing the superimposed substrate against the second thermal treating plate while keeping the superimposed substrate at a second temperature higher than the first temperature;

cooling the bonded superimposed substrate placed on the second thermal treating plate to the first temperature; and placing the bonded superimposed substrate on the first thermal treating plate in the thermal treating unit and cooling the bonded superimposed substrate to a third temperature which is lower than the first temperature, while bonding the superimposed substrate in the bonding unit and either heating the superimposed substrate to the first temperature or cooling the superimposed substrate to the third temperature in the thermal treating unit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 18 is a schematic longitudinal sectional view showing a configuration of the environment around an engagement member.

FIG. 19 is an explanatory view illustrating the engagement member in a bent state.

DETAILED DESCRIPTION

Figure 1:
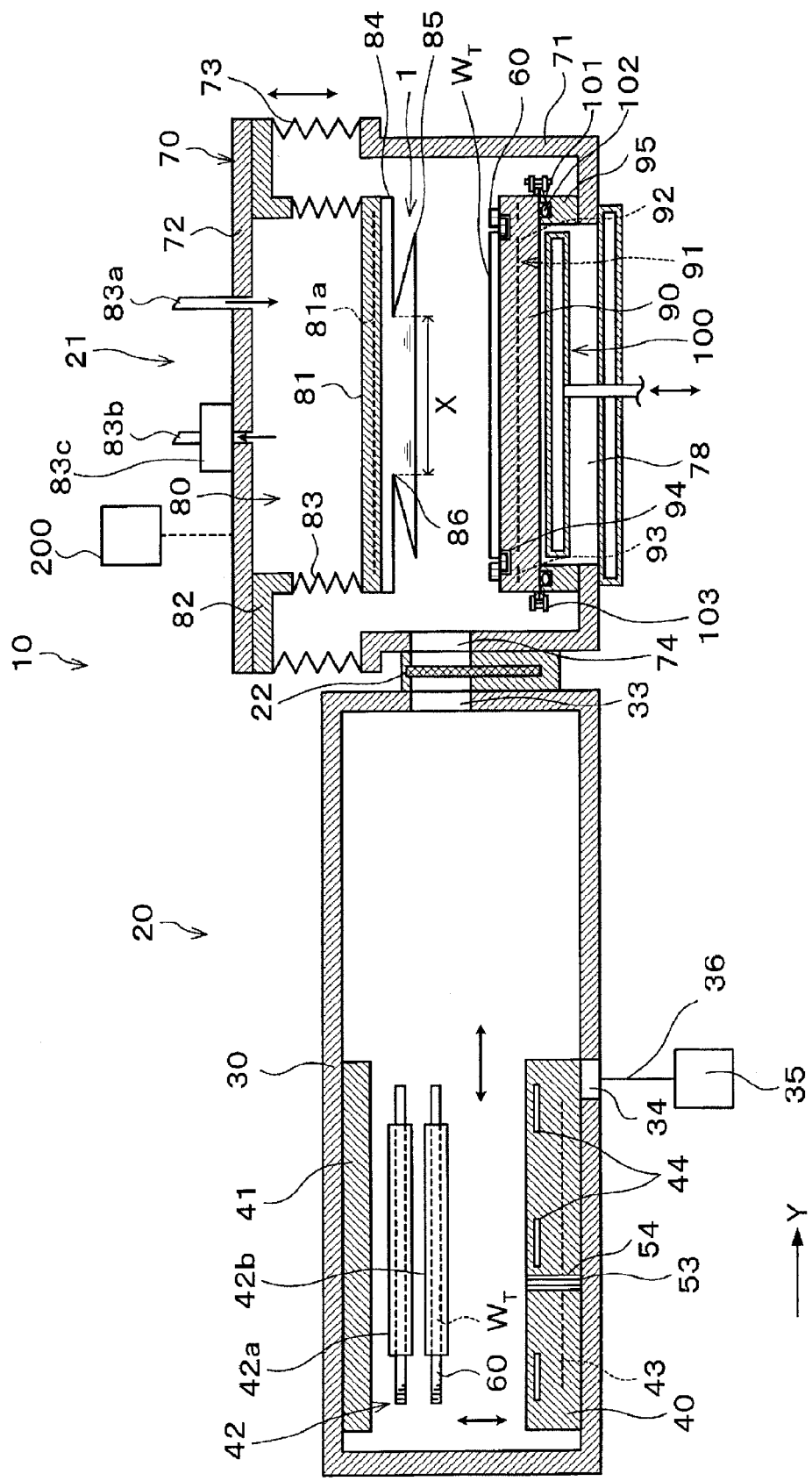
FIG. 1 is a schematic longitudinal sectional view showing a configuration of a bonding apparatus having a pressing adapter.
Figure 2:
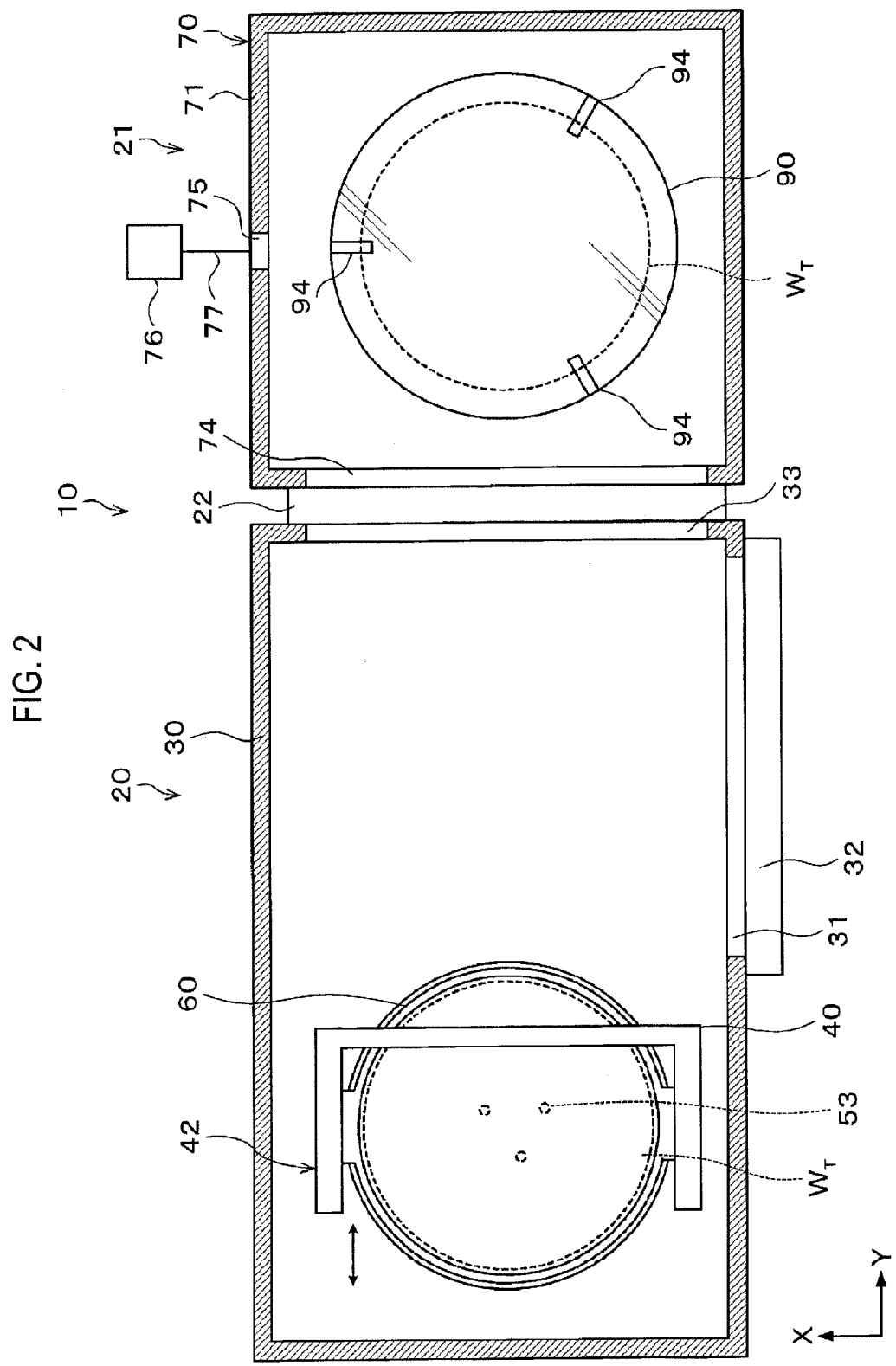
FIG. 2 is a schematic cross sectional view showing a configuration of the bonding apparatus having the pressing adapter.

Embodiments of the present disclosure will now be described in detail with reference to the drawings. FIG. 1 is a schematic longitudinal sectional view showing a configuration of a bonding apparatus 10 having a pressing adapter 1. FIG. 2 is a schematic cross sectional view showing a configuration of the bonding apparatus 10 having the pressing adapter 1.

Figure 3:
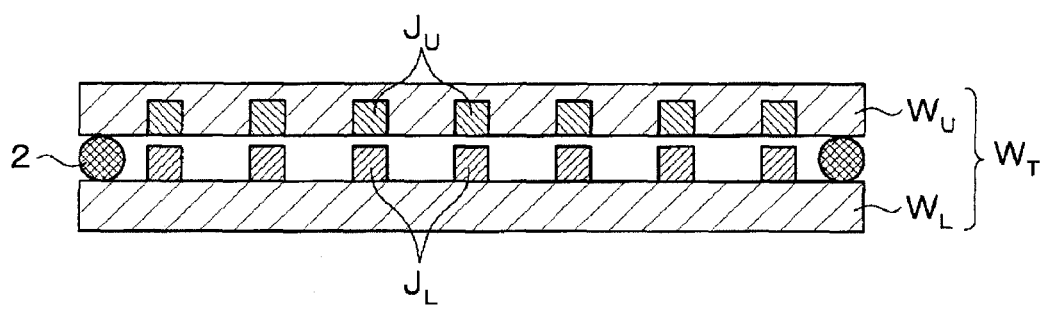
FIG. 3 is a sectional view of overlapping wafers.

In the bonding apparatus 10, for example, wafers $W_U$ and $W_L$ as two substrates are bonded together as shown in FIG. 3. In the following description, a wafer placed on the upper side is sometimes referred to as an "upper wafer $W_U$" and a wafer placed on the lower side is sometimes referred to as a "lower wafer $W_L$." The wafers $W_U$ and $W_L$ have their respective metal bonding portions $J_U$ and $J_L$. A wafer $W_T$ is formed by overlapping or superimposing the wafers $W_U$ and $W_L$ with each other so that the metal bonding portions $J_U$ and $J_L$ are aligned such that the wafers $W_U$ and $W_L$ may be bonded together. In addition, in a state before the wafers $W_U$ and $W_L$ are bonded together, an adhesive 2 is applied between the wafers $W_U$ and $W_L$ so that the wafers $W_U$ and $W_L$ can be temporarily bonded together by the adhesive 2, as shown in FIG. 3. Such temporary bonding by the adhesive 2 can prevent the wafers $W_U$ and $W_L$ from being misaligned even when the wafers $W_U$ and $W_L$ are moved after their alignment. In addition, as shown in FIG. 3, under the state where the wafers $W_U$ and $W_L$ are temporarily bonded together, a gap is formed between the metal bonding portions $J_U$ and $J_L$. This causes an atmosphere between the metal bonding portions $J_U$ and $J_L$ to be suctioned at the time of vacuum pumping in the bonding, thereby preventing voids from being generated between the metal bonding portions $J_U$ and $J_L$. Further, in this embodiment, the adhesive 2 is vaporized or sublimated by thermal treatment in the bonding. In addition, the metal bonding portions $J_U$ and $J_L$ are made of, for example, aluminum and germanium, respectively.

As shown in FIGS. 1 and 2, the bonding apparatus 10 includes a thermal treatment unit 20 and a bonding unit 21 which are arranged in a serially connected manner in a horizontal Y direction. The thermal treatment unit 20 and the bonding unit 21 are air-tightly interconnected via a gate valve 22.

The thermal treatment unit 20 includes an internally-airtight processing container 30. An inlet/outlet 31 of the wafer $W_T$ is formed in the side of the processing container 30, and a gate valve 32 is provided at the inlet/outlet 31. In addition, an inlet/outlet 33 of the wafer $W_T$ is formed in the side of the processing container 30 adjacent to the bonding unit 21 and the gate value 22 is provided at the inlet/outlet 33.

An air-intake port 34 is formed in the bottom of the processing container 30. The air-intake port 34 is connected to an air-intake pipe 36 communicating with a vacuum pump 35 which reduces the internal atmosphere of the processing container 30 to a predetermined degree of vacuum.

Within the processing container 30 are provided a first thermal treating plate 40 which heats and cools the wafer $W_T$ mounted thereon, an upper heating means 41 which heats the wafer $W_T$ mounted in the first thermal treating plate 40 from above, and a carrying mechanism 42 which carries the wafer $W_T$ along with a carrying ring 60, which will be described later, between the thermal treatment unit 20 and the bonding unit 21. An example of the upper heating means 41 may include a halogen heater, an electric heater or the like which generates radiant heat. As shown in FIG. 1, the first thermal treating plate 40 is embedded with a heater 43 as a heating tool which generates heat by power fed thereto, and a refrigerant passage 44 as a cooling mechanism which cools the thermal treating plate 40 by circulating a refrigerant therein. The refrigerant passage 44 is disposed over the heater 43.

Figure 4:
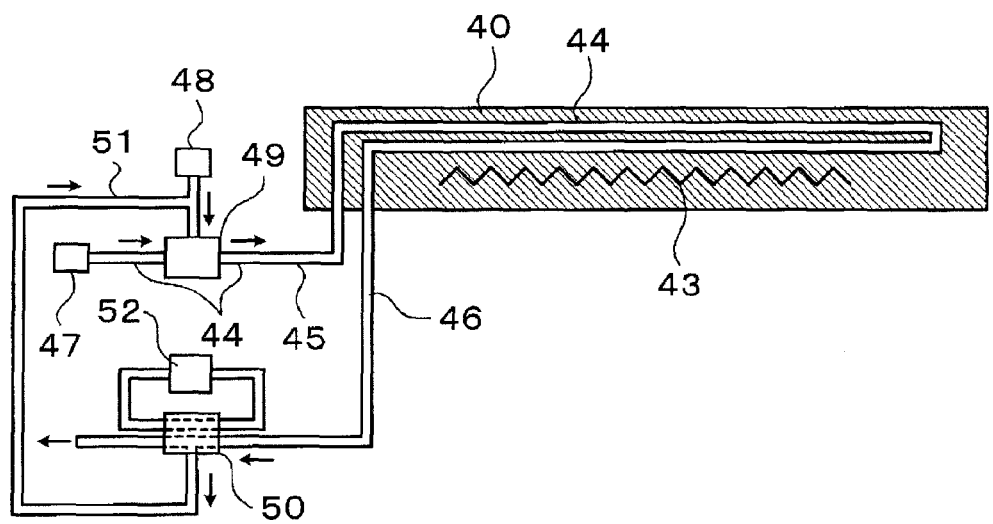
FIG. 4 is a schematic longitudinal sectional view showing a configuration of a first thermal treating plate.

As shown in FIG. 4, the refrigerant passage 44 is connected to a refrigerant feeding pipe 45 which feeds the refrigerant to the refrigerant passage 44, and a refrigerant discharging pipe 46 which discharges the refrigerant from the refrigerant passage 44, respectively. A mixture of dry air and spray-shaped water is used as the refrigerant. The refrigerant feeding pipe 45 is connected to an air source 47 and a cooling water source 48 which supplies dry air and water, acting as the refrigerant, to the refrigerant feeding pipe 45, respectively. A mixer 49 is disposed where the dry air bonds the water. When the dry air and the water are mixed by the mixer 49, the water is sprayed and fed, as the refrigerant, to the refrigerant passage 44 via the refrigerant feeding pipe 45. The refrigerant discharging pipe 46 is provided with a heat exchanger 50 which cools the refrigerant passed through the refrigerant passage 44. When the refrigerant flowing through the refrigerant discharging pipe 46 is cooled by the heat exchanger 50, the water in the refrigerant is condensed and collected as it drains. The collected draining refrigerant is fed upstream of the mixer 49 in the refrigerant feeding pipe 45 via a circulation pipe 51 and is mixed with the dry air by the mixer 49 for reuse as the refrigerant. Further, for example, the heat exchanger 50 is connected to a refrigerator 52, as shown in FIG. 4. In addition, heating temperature and cooling temperature of the first thermal treating plate 40 and heating temperature of the upper heating means 41 are controlled by, for example, a control unit 200 which will be described later.

A plurality of (for example, three) elevating pins which elevates the wafer $W_T$ with the wafers supported from bottom is disposed below the first thermal treating plate 40. The elevating pins 53 can be vertically moved by an elevation driver (not shown). A plurality of (for example, three) through holes 54 which penetrates the first thermal treating plate 40 in its thickness direction is formed near the central portion of the first thermal treating plate 40. The elevating pins 53 are inserted through the through holes 54 in such a manner that they project from the top of the first thermal treating plate 40.

Figure 5:
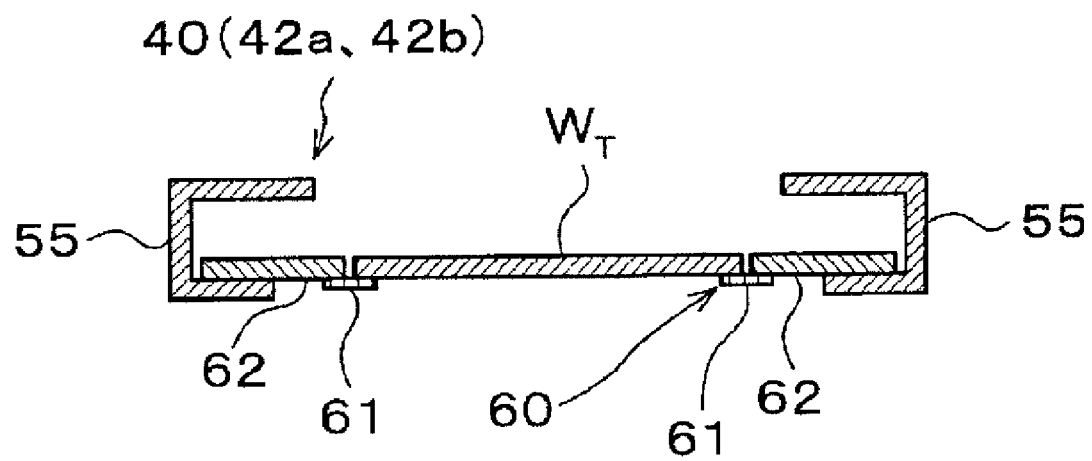
FIG. 5 is a schematic longitudinal sectional view showing a configuration of a carrying mechanism and a carrying ring.
Figure 6:
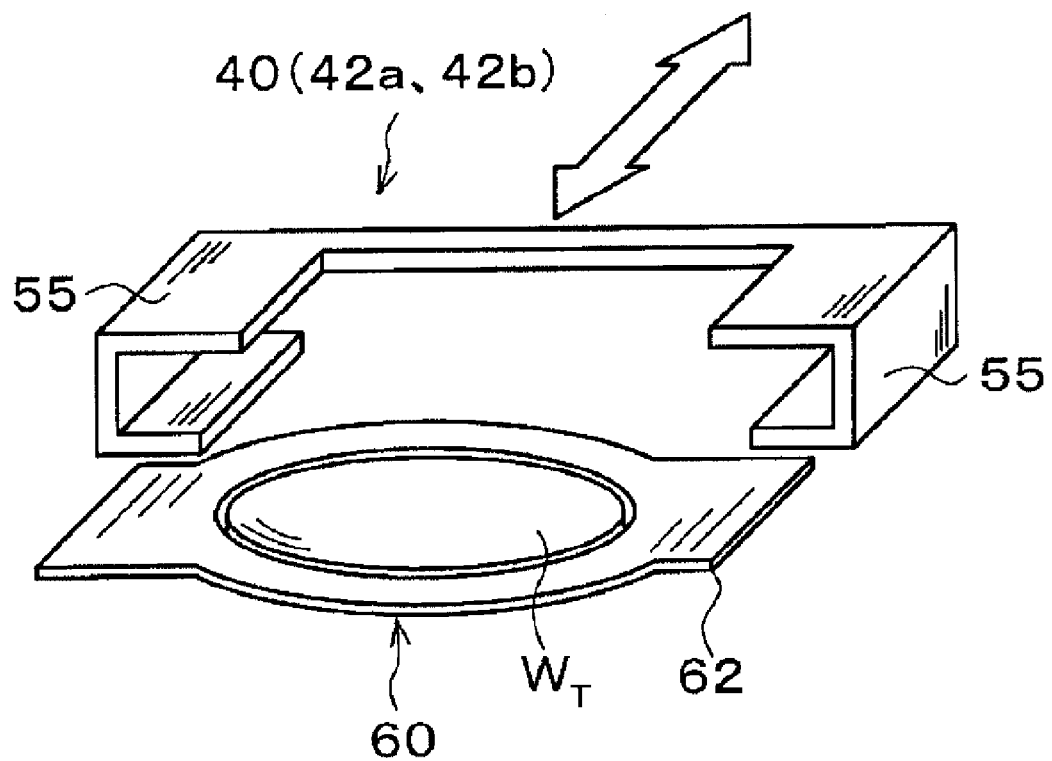
FIG. 6 is a schematic perspective view showing a configuration of the carrying mechanism and the carrying ring.
Figure 7A:
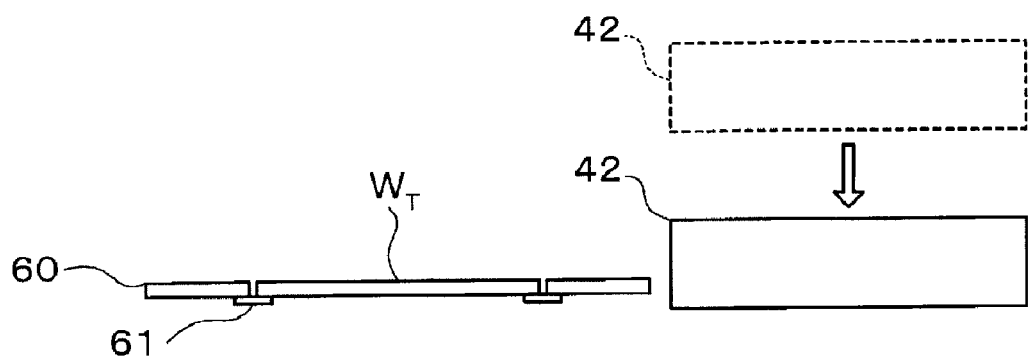
FIGS. 7A, 7B and 7C are explanatory views illustrating how the carrying ring is held by the carrying mechanism.
Figure 7B:
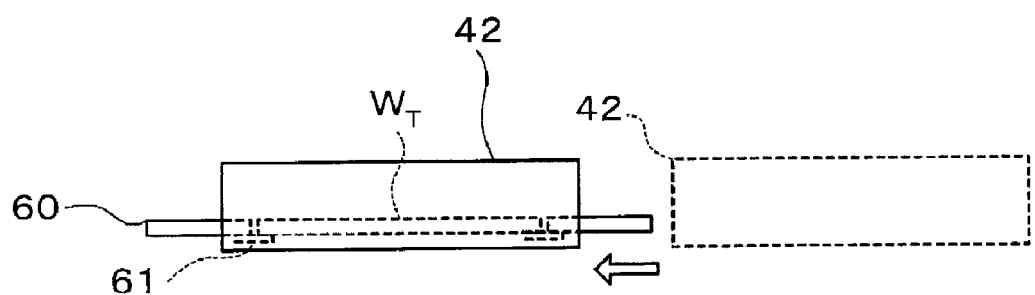
Figure 7C:
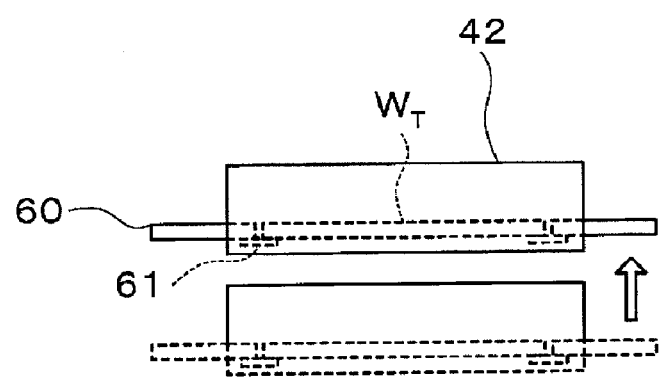

The carrying mechanism 42 includes an upper carrying mechanism 42a and a lower carrying mechanism 42b which are horizontally disposed in a vertical direction, as shown in FIG. 1. The upper carrying mechanism 42a and the lower carrying mechanism 42b have the same shape. The upper carrying mechanism 42a and the lower carrying mechanism 42b are configured to be moved separately in both horizontal and vertical directions by means of a driving mechanism (not shown). The upper carrying mechanism 42a and the lower carrying mechanism 42b each includes a pair of holders 55 having a U-like section, with their U-like openings facing each other, as shown in FIGS. 5 and 6. The upper carrying mechanism 42a and the lower carrying mechanism 42b are configured to carry the wafer $W_T$ along with the carrying ring 60 by holding the carrying ring 60 by means of the holders 55. As shown in FIGS. 5 and 6, the carrying ring 60 has a disc shape having an opening of a diameter slightly larger than a diameter of the wafer $W_T$ and a holding member 61 which holds the wafer $W_T$ at the bottom of the carrying ring 60, in the inner circumference of the opening. As shown in FIG. 6, a pair of projections 62 is formed in the periphery of the carrying ring 60 and is held by the holders 55 of the carrying mechanism 42. In holding the carrying ring 60 by means of the carrying mechanism 42, the carrying mechanism 42 is moved to a height at which the carrying ring 60 is located between the openings of the holders 55, as shown in FIG. 7A, and then the carrying mechanism 42 is further horizontally moved maintaining its height, as shown in FIG. 7B. Thereafter, the carrying mechanism 42 is elevated and the projections 62 of the carrying ring 60 are held by the holders 55 so that the carrying ring 60 is held by the carrying mechanism 42, as shown in FIG. 7C.

The bonding unit 21 has an internally-airtight processing container 70. The processing container 70 includes a container body 71 and a top plate 72 connected by a shield bellows 73. The shield bellows 73 can be freely vertically expanded/contracted and the top plate 72 can be freely vertically moved by the shield bellows 73.

An inlet/outlet 74 for the wafer $W_T$ is formed in the side of the container body 71 at a side of the thermal treatment unit 20 and the above-mentioned gate valve 22 is disposed in the inlet/outlet 74. An air-intake port 75 is formed in the side of the container body 71. An air-intake pipe 77 communicating with a vacuum pump 76 which reduces the internal atmosphere of the processing container 70 to a predetermined degree of vacuum is connected to the air-intake port 75. In this embodiment, the air-intake port 75, the vacuum pump 76 and the air-intake pipe 77 constitute a second decompression mechanism. In addition, for example, in the bottom of the container body 71 is formed a circular bottom opening 78 in which a cooling mechanism 100, which will be described later, is placed.

A pressing mechanism 80 which presses the wafer $W_T$ on a second thermal treating plate 90, which will be described later, toward the second thermal treating plate 90 is provided in the top plate 72 within the processing container 70. The pressing mechanism 80 includes a pressing member 81 which presses the wafer $W_T$ via the pressing adapter 1, an annular supporting member 82 attached to the top plate 72, and a pressing bellows 83 which connects the pressing member 81 with the supporting member 82 and can be freely vertically expanded/contacted. A diameter of the pressing member 81 is made larger than the diameter of the wafer $W_T$. The pressing bellows 83 is provided with an air feeding pipe 83a which feeds, for example, compressed air to the inside of the pressing mechanism 80, that is, an inner space surrounded by the pressing member 81, the pressing bellows 83, the supporting member 82 and the top plate 72, and an air discharging pipe 83b which discharges air fed to the inner space. Accordingly, by feeding the compressed air to the inner space of the pressing mechanism 80 via the air feeding pipe 83a, the pressing bellows 83 can be expanded/contracted so that the pressing member 81 can be freely vertically moved. The air discharging pipe 83b is provided with a cooling jacket 83c which cools air circulated in and discharged from the air discharging pipe 83b. The cooling jacket 83c may be, for example, a water cooling heat exchanger in the shape of a shell or tube. The air discharging pipe 83b is also provided with a regulating mechanism (not shown) which regulates the amount of air discharged from the air discharging pipe 83b. Accordingly, by regulating the amount and pressure of feed of the compressed air fed by the air feeding pipe 83a and the amount of air discharged from the air discharging pipe 83b, the internal pressure of the pressing bellows 83 can be adjusted to a desired pressure while discharging the compressed air from the air discharging pipe 83b. In other words, the internal pressure of the pressing bellows 83 and the amount of compressed air circulated in the pressing bellows 83 can be separately controlled. In addition, a heater 81a which generates heat by feed of power is embedded in the pressing member 81, and thus, by regulating the amount of compressed air fed to the pressing bellows 83, the amount of heat emitted from the heater 81a to the compressed air within the pressing bellows 83 can be adjusted. Accordingly, by regulating the flow rate of compressed air fed into the pressing bellows 83 and the temperature of the heater 81a, the temperature of the pressing adapter 1 can be adjusted to a desired temperature through heat transfer by the pressing member 81. In addition, since the compressed air is sealed within the pressing mechanism 80, the pressing bellows 83 of the pressing mechanism 80 is made more rigid than the shield bellows 73 of the processing container 70 so that the pressing bellows 83 can endure the internal pressure caused by the compressed air.

The pressing adapter 1 is connected to the bottom of the pressing member 81. The pressing adapter 1 uses the pressing member 81 having a diameter larger than the diameter of the wafer $W_T$ and is provided to press the wafer $W_T$ with a uniform in-plane load. As shown in FIG. 1, the pressing adapter 1 includes a disc-like upper adapter 84 and a conical trapezoid-like lower adapter 85 which are integrated. The upper adapter 84 and the lower adapter 85 are concentrically arranged when viewed from the top. In addition, the bottom side of the conical trapezoid-like lower adapter 85 has the same diameter as the wafer $W_T$ and a diameter of the top side of the lower adapter 85 is smaller than the diameter of the upper adapter such that the pressing adapter 1 has a narrow portion 86 in the middle.

Figure 8:
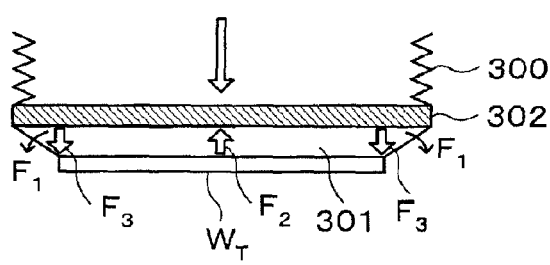
FIG. 8 is a schematic longitudinal sectional view showing a bonding method.
Figure 22:
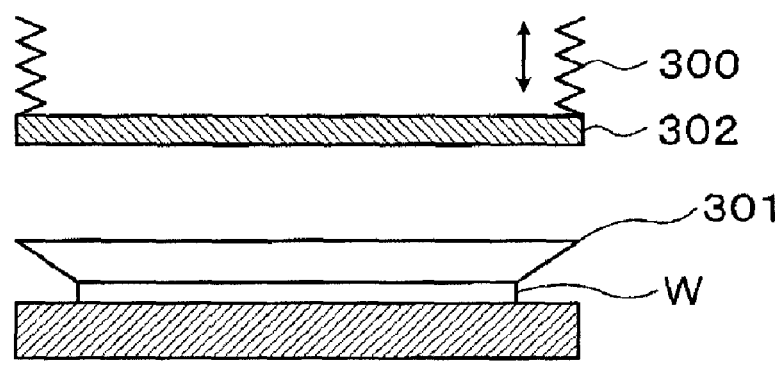
FIG. 22 is a schematic longitudinal sectional view showing a conventional bonding method.

The shape of the pressing adapter 1 will be now described in more detail. As described above, the inventors have observed that, even when a conical trapezoid-like adapter 301 shown in FIG. 22 is arranged with its trapezoidal top side directed downward and a pressing member 302 having a diameter larger than that of a wafer W presses the wafer W via the adapter 301 having a diameter different from that of the wafer W, a load is still concentrated on the circumference of the wafer $W_T$. The inventors have verified this observation and have found that, when the adapter 301 is used to press the wafer $W_T$, a stress $F_1$ is applied to the outer circumference of the adapter 301, for example as shown in FIG. 8, such that the adapter 301 is bent, and accordingly an upward stress $F_2$ is concentrated near the center of the adapter 301 while a downward stress $F_3$ is concentrated on the outer circumference of the adapter 301, thereby making it impossible to obtain a uniform in-plane load when the wafer $W_T$ is pressed.

Figure 9:
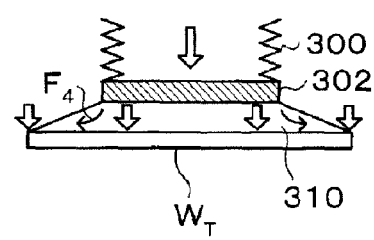
FIG. 9 is a schematic longitudinal sectional view showing a bonding method.

In this regard, the inventors have observed that, even when a conical trapezoid-like adapter is used like the adapter 301, for example when a conical trapezoid-like adapter 310 is arranged with its top side directed upward, as shown in FIG. 9, a stress $F_4$ exerted on the adapter 310 is distributed to its bottom side, thereby making it possible to avoid concentration of the stress on the circumference of the adapter 310. However, in comparison with the adapter 310 and the adapter 301, since an area of the top side of the adapter 310 is smaller than an area of the top side of the adapter 301, in order to obtain a pressing load from the adapter 310, there is a need to further increase the pressure of pressing air fed to a bellows 300 as compared with the adapter 301, which may cause trouble in terms of air source.

Therefore, the inventors believe that a shape such as the pressing adapter 1 including the disc-like upper adapter 84, the conical trapezoid-like lower adapter 85 and the narrow portion 86 in the middle between the upper adapter 84 and the lower adapter 85 is effective in obtaining a uniform in-plane load when pressing the wafer $W_T$ while increasing the contact area between the pressing bellows and the adapter. In addition, it has been observed by experiment that, as a result of pressing the wafer $W_T$ while varying dimensions of the upper adapter 84 and the lower adapter 85, the wafer $W_T$ can be satisfactorily pressed if a ratio of the diameter of the narrow portion 86 to the diameter of the wafer $W_T$ is 0.7:1 to 1:1.

The experiment carried out by the inventors will be described below. In bonding the wafer $W_T$ using the pressing adapter 1, a test on a load exerted on a plane of the wafer $W_T$ was performed while changing an elasticity modulus of material of the pressing adapter 1, the diameter of the upper adapter 84, the diameter of the lower adapter 85 and the diameter of the wafer $W_T$. In such a case, the heating temperature of the first thermal treating plate 40 and the upper heating means 41 was set to 350 degrees Celsius and the heating temperature of the second thermal treating plate 90, which will be described later, was set to 430 degrees Celsius. In addition, a halogen heater was used as the upper heating means 41.

The pressing adapter 1 was configured such that the diameter of the upper adapter 84 is 350 mm, the diameter of the wafer $W_T$ and the diameter of the bottom side of the lower adapter 85 are 200 mm, the height of the pressing adapter 1, in other words, a distance from the top side of the upper adapter 84 to the bottom side of the lower adapter 85, is 35 mm, and the height from the bottom side of the lower adapter 85 to the narrow portion 86, in other words, a distance from the bottom side of the lower adapter 85 to its top side, is 19 mm. In addition, the material of the pressing adapter 1 was stainless steel having an elasticity modulus of 200 GPa, silicon carbide (SiC) having an elasticity modulus of 410 GPa, and cemented carbide having an elasticity modulus of 620 GPa. When the diameter X of the narrow portion 86 in the pressing adapter 1 made of the above-mentioned material was changed from 100 mm to 200 mm, a difference between the maximum stress and the minimum stress applied to the plane of the wafer $W_T$, i.e., the maximum stress difference, was observed. A result of the observation is shown in FIG. 10.

Figure 10:
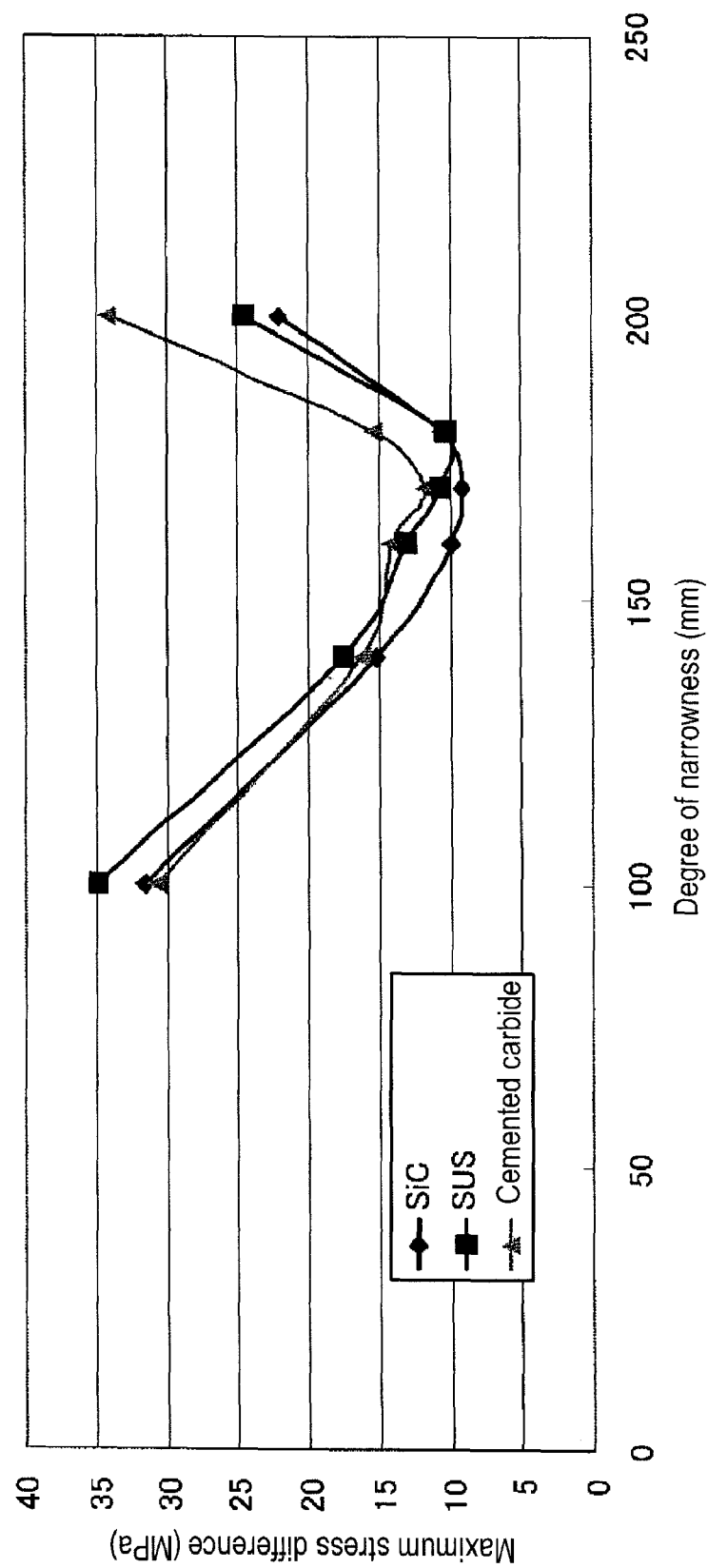
FIG. 10 is a graph showing a relationship between material and degree of narrowness of a pressing adapter, and the maximum stress difference.

FIG. 10 shows a relationship between the diameter X of the narrow portion 86 as a degree of narrowness (represented by a horizontal axis) and the maximum stress difference (represented by a vertical axis) when the pressing adapter 1 having a different elasticity modulus was used to press the wafer $W_T$. As shown in FIG. 10, when the degree of narrowness was set to 160 mm to 180 mm, it has been observed that the maximum stress difference in each pressing adapter 1 is minimal irrespective of the elasticity modulus of the pressing adapter 1. From this observation, it could be seen that an optimal value exists in the degree of narrowness of the pressing adapter 1 and this optimal degree of narrowness does not depend on the elasticity modulus of the material of the pressing adapter 1.

Next, in the pressing adapter 1 made of silicon nitride having an elasticity modulus of 410 GPa, when the diameter of the upper adapter 84 was 350 mm and the diameter of the wafer $W_T$ and the diameter of the bottom side of the lower adapter 85 were 300 mm, when the diameter of the upper adapter 84 was 525 mm and the diameter of the wafer $W_T$ and the diameter of the bottom side of the lower adapter 85 were 300 mm, and when the diameter of the upper adapter 84 was 350 mm and the diameter of the wafer $W_T$ and the diameter of the bottom side of the lower adapter 85 were 200 mm, a maximum stress difference in the plane of the wafer $W_T$ while varying the degree of narrowness of each pressing adapter 1 was observed. A result of the observation is shown in FIG. 11.

Figure 11:
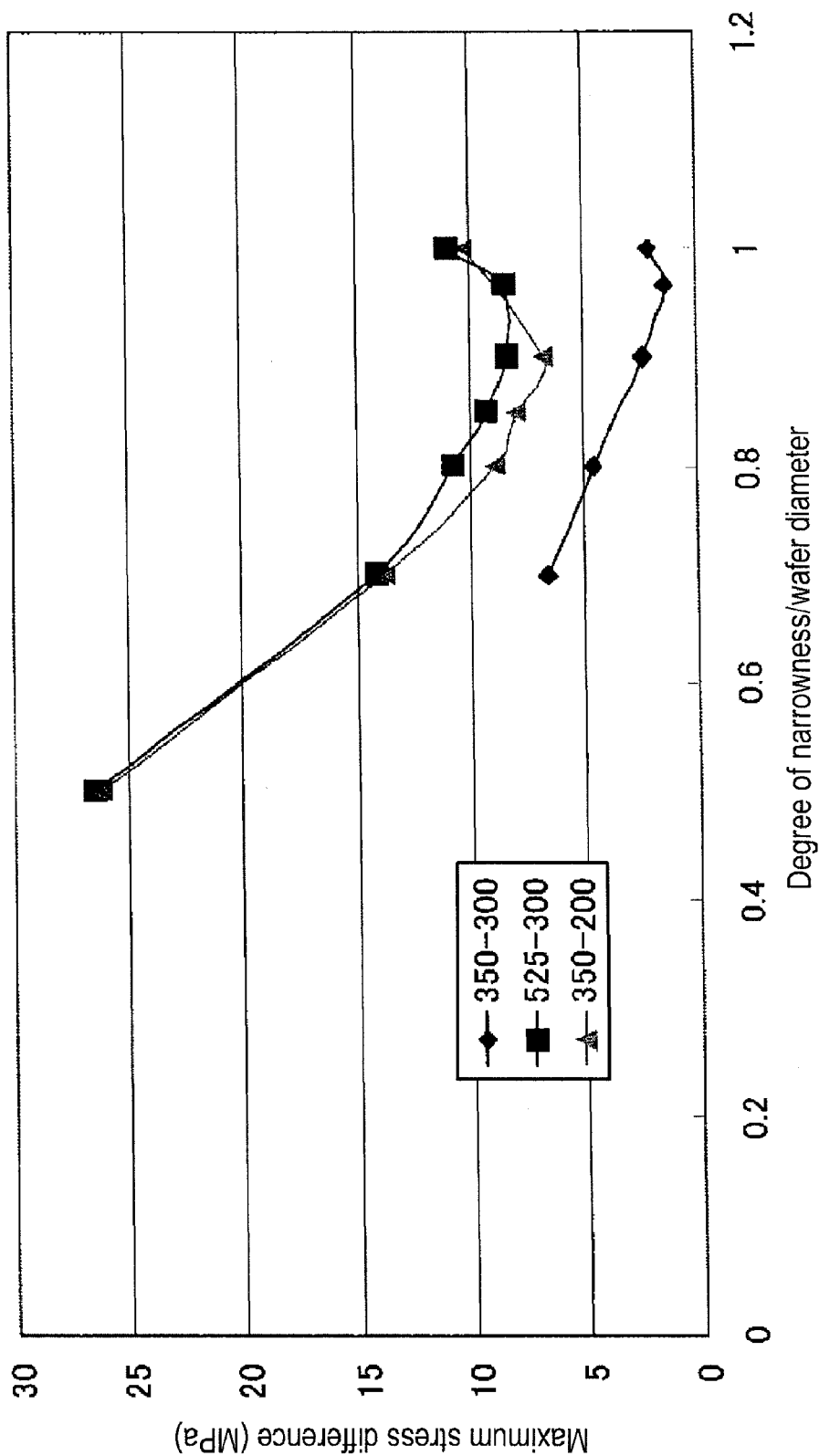
FIG. 11 is a graph showing a relationship between wafer diameter, degree of narrowness of a pressing adapter, and the maximum stress difference.

FIG. 11 shows a relationship between a ratio of the degree of narrowness to the diameter of the wafer $W_T$ (the diameter of the bottom side of the lower adapter 85) (represented by a horizontal axis) and the maximum stress difference (represented by a vertical axis) when the wafer $W_T$ is pressed by each pressing adapter 1. As shown in FIG. 11, when the ratio of the degree of narrowness to the diameter of the wafer $W_T$ was set to about 0.7:1 to 1:1, it has been observed that the maximum stress difference in each pressing adapter 1 is minimal irrespective of the diameter of the upper adapter 84 and the diameter of the bottom side of the lower adapter 85. As a result, from the results shown in FIGS. 10 and 11, it can be seen that the maximum stress difference in the plane of the wafer $W_T$ can be minimal by setting the ratio of the degree of narrowness to the diameter of the bottom side of the lower adapter 85 to a proper value irrespective of the elasticity modulus of the material of the pressing adapter 1, the diameter of the upper adapter 84 and the diameter of the bottom side of the lower adapter 85.

If the maximum stress difference in the plane of the wafer $W_T$ is within 15 MPa, it may be determined that the wafer is pressed with a uniform load. Accordingly, in order to press the wafer $W_T$ with a uniform load using the pressing member 81 having a diameter larger than that of the wafer $W_T$, the ratio of the degree of narrowness of the pressing adapter 1, that is, the diameter of the narrow portion 86, to the diameter of the bottom side of the lower adapter 85 may be 0.7:1 to 1:1 in some embodiments, and may also be 0.8:1 to 0.9:1 in other embodiments.

Figure 12:
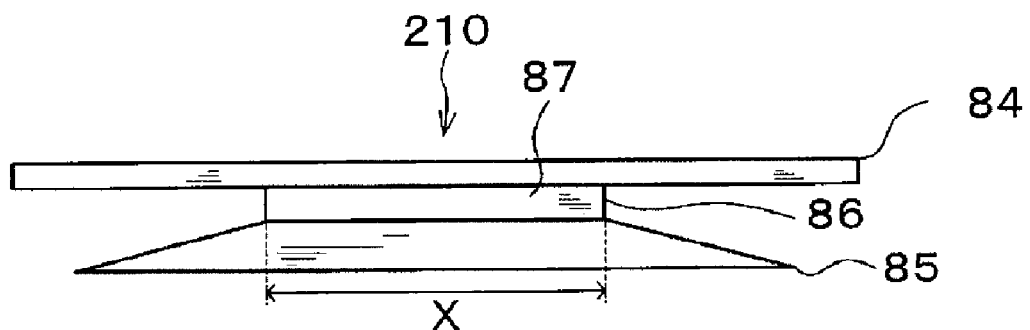
FIG. 12 is a side view showing another pressing adapter.
Figure 13:
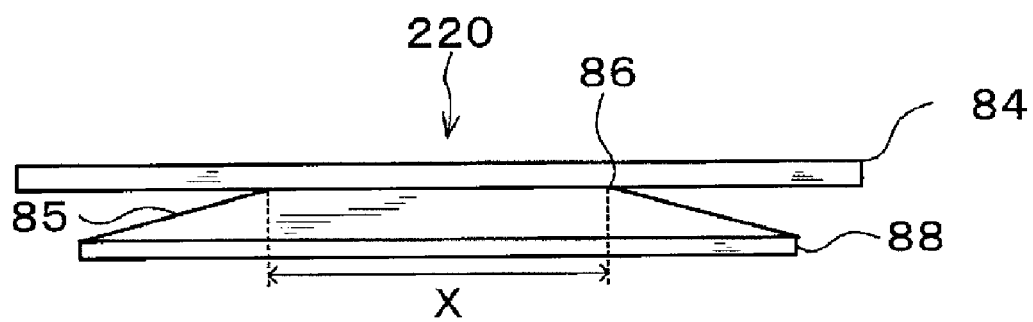
FIG. 13 is a side view showing another pressing adapter.
Figure 14:
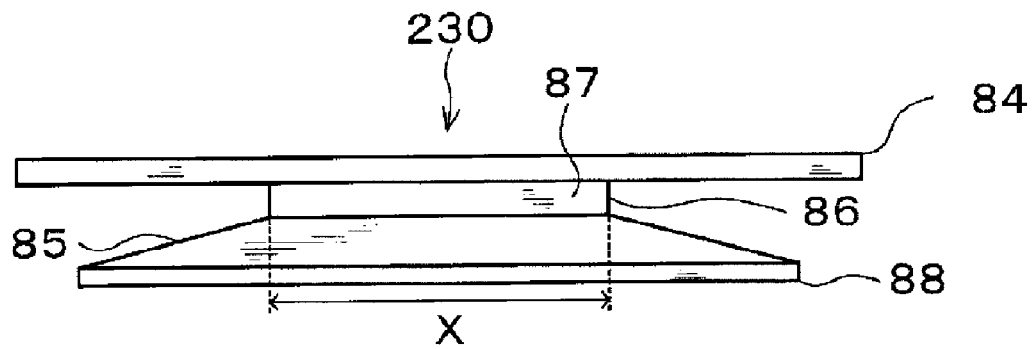
FIG. 14 is a side view showing another pressing adapter.

Although the pressing adapter 1 including the upper adapter 84, the lower adapter 85, which are integrated, and the narrow portion 86 was used in the above test, the shape of the pressing adapter 1 is not limited to the above embodiment. Instead of the pressing adapter 1, the inventors have found that a pressing adapter 210 having a cylindrical connector 87 may be used to form the narrow portion 86 in the middle between the upper adapter 84 and the lower adapter 85, as shown in FIG. 12, or a pressing adapter 220 including a disc portion 88 having the same diameter as the diameter of the bottom side of the lower adapter 85 and integrated with the lower portion of the lower adapter 85 may be used to form the narrow portion 86, as shown in FIG. 13. In addition, as shown in FIG. 14, an adapter 230 including both of the connector 87 and the disc portion 88 may be used. Any adapter can be used to uniformly apply a uniform load on a large area to a small area.

Figure 15:
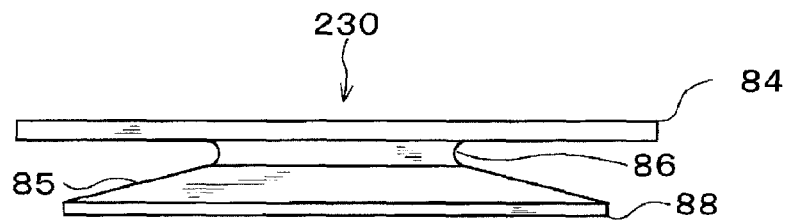
FIG. 15 is a side view showing another pressing adapter.

Although in this embodiment the narrow portion 86 is formed at an acute angle or a right angle, the narrow portion 86 may be formed in a spherical shape having a predetermined curvature. By example of the adapter 230, the narrow portion 86 may be formed in a semi-circular shape by indenting the circumference of the connector 87 inwardly, as shown in FIG. 15. In this case, as a stress due to a pressing load is concentrated on the narrow portion 86, the narrow portion 86 of each of the pressing adapters 1, 210, 220 and 230 can be prevented from being damaged.

Figure 16:
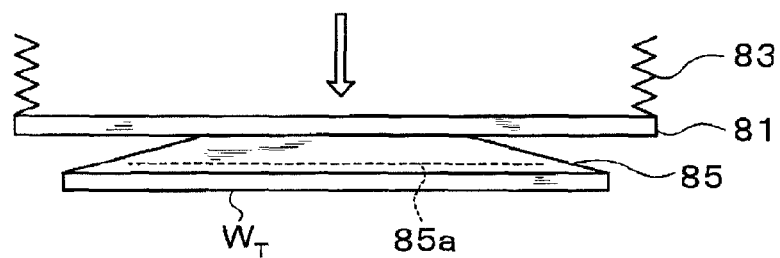
FIG. 16 is a side view showing another pressing adapter.

In addition, although the pressing adapter in the above embodiment is separated from the pressing member 81 of the pressing mechanism 80, the pressing member 81 and the pressing adapter may be integrated. Specifically, for example, as shown in FIG. 16, only a portion of the lower adapter 85 of the pressing adapter 1 may be bonded to the lower side of the pressing member 81. In this case, instead of the heater 81a embedded in the pressing member 81, a heater 85a may be embedded in the lower adapter 85. When the heater 85a is embedded in the lower adapter 85, since there is no need to consider heat capacity of the pressing adapter 1 interposed between the heater 81a and the wafer $W_T$, it is possible to control the temperature of the wafer $W_T$ with higher precision and shorten the time required to heat the wafer $W_T$. Further, since there is no loss in heat transfer in the contact surface between the pressing member 81 and the pressing adapter 1 by integrating the pressing adapter 1 with the pressing member 81, efficiency of heat transfer in the contact surface between the pressing member 81 and the pressing adapter 1 can be improved. In addition, although the integration of the pressing member 81 with the pressing adapter 1 is shown in FIG. 16, the pressing member 81 may be integrated with other pressing adapters 210, 220 and 230.

Next, the second thermal treating plate 90 will be described. As shown in FIG. 1, the second thermal treating plate 90 as a mounting unit which mounts and heats the wafer $W_T$ is disposed at a position facing the pressing mechanism 80 below the pressing mechanism 80 within the processing container 70. A heater 91 which generates heat from the power being fed to it is embedded in the second thermal treating plate 90. The second thermal treating plate 90 is made of, for example, ceramics such as aluminum nitride. The heater 91 includes an inner circumferential heater 92 embedded in a position corresponding to the wafer $W_T$ and an outer circumferential heater 93 which is concentrically disposed in the outside of the inner circumferential heater 92 and is temperature-controllable independent of the inner circumferential heater 92. The heating temperature of the inner and outer circumferential heaters 92 and 93 is controlled by the control unit 200 which will be described later. In addition, as shown in FIG. 1, cut-out grooves 94 which accommodate the holding member 61 of the carrying ring 60 carried by the carrying mechanism 42 are formed in the outer circumference of the second thermal treating plate 90. As shown in FIG. 2, three cut-out grooves 94 in circumferential portions of the second thermal treating plate 90 are formed in positions corresponding to the holding member 61 of the carrying ring 60.

Figure 17:
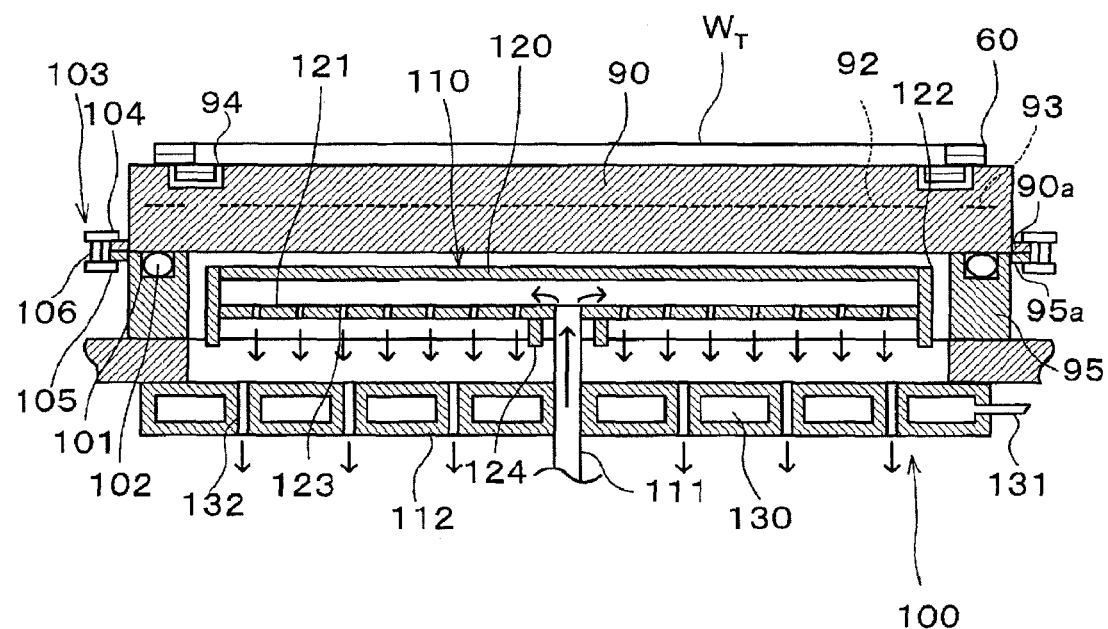
FIG. 17 is a schematic longitudinal sectional view showing a configuration of the environment around a cooling mechanism.

As shown in FIGS. 1 and 17, the outer circumference of the second thermal treating plate 90 is supported by the top of an annular supporter 95 provided along the bottom opening 78 of the container body 71 as an inner surface of the container body 71. Accordingly, the bottom of the second thermal treating plate 90 is exposed to the outside of the processing container 70 via the bottom opening 78. The cooling mechanism 100 which cools the wafer $W_T$ is disposed at a side of the bottom of the second thermal treating plate 90, in other words, outside of the processing container 70. The supporter 95 is a substantially cylindrical member which prevents heat from the second thermal treating plate 90 from being transferred to the container body 71 and is made of, for example, adiabatic ceramics such as silicon nitride. A concaved groove 101 is concentrically formed with the second thermal treating plate 90 in a surface of the supporter 95 facing the second thermal treating plate 90. A seal member 102 is arranged within the groove 101 to provide an airtight seal between the supporter 95 and the second thermal treating plate 90. The seal member 102 is formed of, for example, a heat-resistant metal O-ring.

Flanges 90a and 95a are formed in outer circumferences of the second thermal treating plate 90 and the supporter 95, respectively, as shown in FIGS. 17 and 18. The flanges 90a and 95a are held by an engagement member 103 so that a force is exerted in a direction in which they press the seal member 102. As shown in FIGS. 17 and 18, the engagement member 103 includes an upper engagement portion 104 contacting the flange 90a, a lower engagement portion 105 contacting the flange 95a, and a connecting portion 106 connecting the upper engagement portion 104 with the lower engagement portion 105. The connecting portion 106 is, for example, a male screw having a thread and is combined with a female screw (not shown) formed in the lower engagement portion 105 in order to exert a force in a direction in which the upper engagement portion 104 and the lower engagement portion 105 press the seal member 102, so that the processing container 70 can be made airtight. The upper engagement portion 104, the lower engagement portion 105 and the connecting portion 106 are made of, for example, metal material such as stainless steel having strength and elasticity required for the engagement member. Since elastic material is used for the connecting portion 106, when the second thermal treating plate 90 is heated by the heater 91 and a difference in thermal expansion occurs between the second thermal treating plate 90 and the supporter 95, the connecting portion 106 is bent, for example as shown in FIG. 19, thereby preventing the engagement member 103 from being damaged and providing an airtight seal between the second thermal treating plate 90 and the supporter 95. In addition, as shown in FIG. 18, a claw 104a projecting toward the top of the flange 90a is formed in the upper engagement portion 104 and a claw 105a projecting toward the bottom of the flange 95a is formed in the lower engagement portion 105. Therefore, as shown in FIG. 19, even when the connecting portion 106 is bent, the engagement member 103 can be prevented from being separated from the flange portions 90a and 95a.

As shown in FIG. 17, the cooling mechanism 100 includes a hollow disc-like cooling plate 110 which is disposed in parallel to the second thermal treating plate 90, a communicating pipe 111 which vertically extends to communicate with the hollow portion of the cooling plate 110, and a cooling water circulating plate 112 which is disposed below the cooling plate 110 in parallel to the cooling plate 110. The cooling plate 110, the communicating pipe 111 and the cooling water circulating plate 112 are made of, for example, a copper alloy having excellent thermal conductivity.

The cooling plate 110 includes a contact portion 120 which is disposed in parallel with the back side of the thermal treating plate 90 and cools the thermal treating plate 90 by making contact with the back side of the thermal treating plate 90, a heat radiating portion 121 which is disposed in parallel to the contact portion 120 and has through holes arranged with a predetermined interval, and a circumferential portion 122 which surrounds the contact portion 120 and the heat radiating portion 121. The heat radiating portion 121 has a plurality of through holes 123 which is formed in a predetermined pattern and communicates with the inside of the cooling plate 110. The communicating pipe 111 communicates with the center of the heat radiating portion 121. In addition, the communicating pipe 111 is inserted through the cooling water circulating plate 112 and can be freely slid with respect to the cooling water circulating plate 112. Thus, the cooling plate 110 can be vertically moved by vertically moving the communicating pipe 111 by means of an elevating mechanism (not shown).

An air source (not shown) which feeds air as a refrigerant to the cooling plate 110 is connected to the communicating pipe 111. The air fed into the hollow portion of the cooling plate 110 via the communicating pipe 111 is discharged from the through holes 123 of the heat radiating portion 121.

A convex projection 124 projecting downward is formed in the bottom of the heat radiating portion 121. The circumferential portion 122 extends to the same position as a leading end of the projection 124. Therefore, when the cooling plate 110 is descended, a space surrounded by the projection 124, the circumferential portion 122 and the cooling water circulating plate 112 can be formed.

As shown in FIG. 17, a cooling water passage 130 which circulates cooling water in the cooling water circulating plate 112 is formed in the cooling water circulating plate 112. A cooling water pipe 131 which feeds cooling water from a cooling water source (not shown) to the cooling water passage 130 is connected to the cooling water passage 130. In addition, through holes 132 are formed in a predetermined pattern in the cooling water circulating plate 112, like the heat radiating portion 121, and air as a refrigerant discharged from the heat radiating portion 121 can be discharged out of the cooling mechanism 100. Accordingly, the cooling mechanism 100 can cool the cooling plate 110 by feeding air as a refrigerant into the cooling plate 110 via the communicating pipe 111 and the cooling plate 110 can cool the thermal treating plate 90 by elevating the communicating pipe 111 by means of the elevating mechanism (not shown) and contacting the cooling plate 110 to the bottom of the second thermal treating plate 90. At this time, by cooling the cooling water circulating plate 112 with cooling water fed into the cooling water passage 130 of the cooling water circulating plate 112, the air passing through the through holes 132 can be cooled, thereby preventing hot air from being discharged out of the cooling mechanism 100. Further, by lowering the communicating pipe 111 and contacting the cooling water circulating plate 112 to the projection 124 formed in the bottom of the heat radiating portion 121, the cooling plate 110 can be cooled with high efficiency, along with air fed into the communicating pipe 111.

As shown in FIG. 1, the bonding apparatus 10 has the control unit 200. The control unit 200 is, for example, a computer and includes a program storage (not shown). The program storage stores a program which controls processing of the wafer $W_T$ in the bonding apparatus 10. The program storage also stores a program which controls operation of a driving system including the above-described processing devices and carrying device to implement a bonding process in a bonding system 1, which will be described below. The programs may be installed in the control unit 200 from a computer readable storage medium H such as, for example, a hard disk (HD), a flexible disk (FD), a compact disk (CD), a magneto-optical disk (MO), a memory card or the like.

Figure 20:
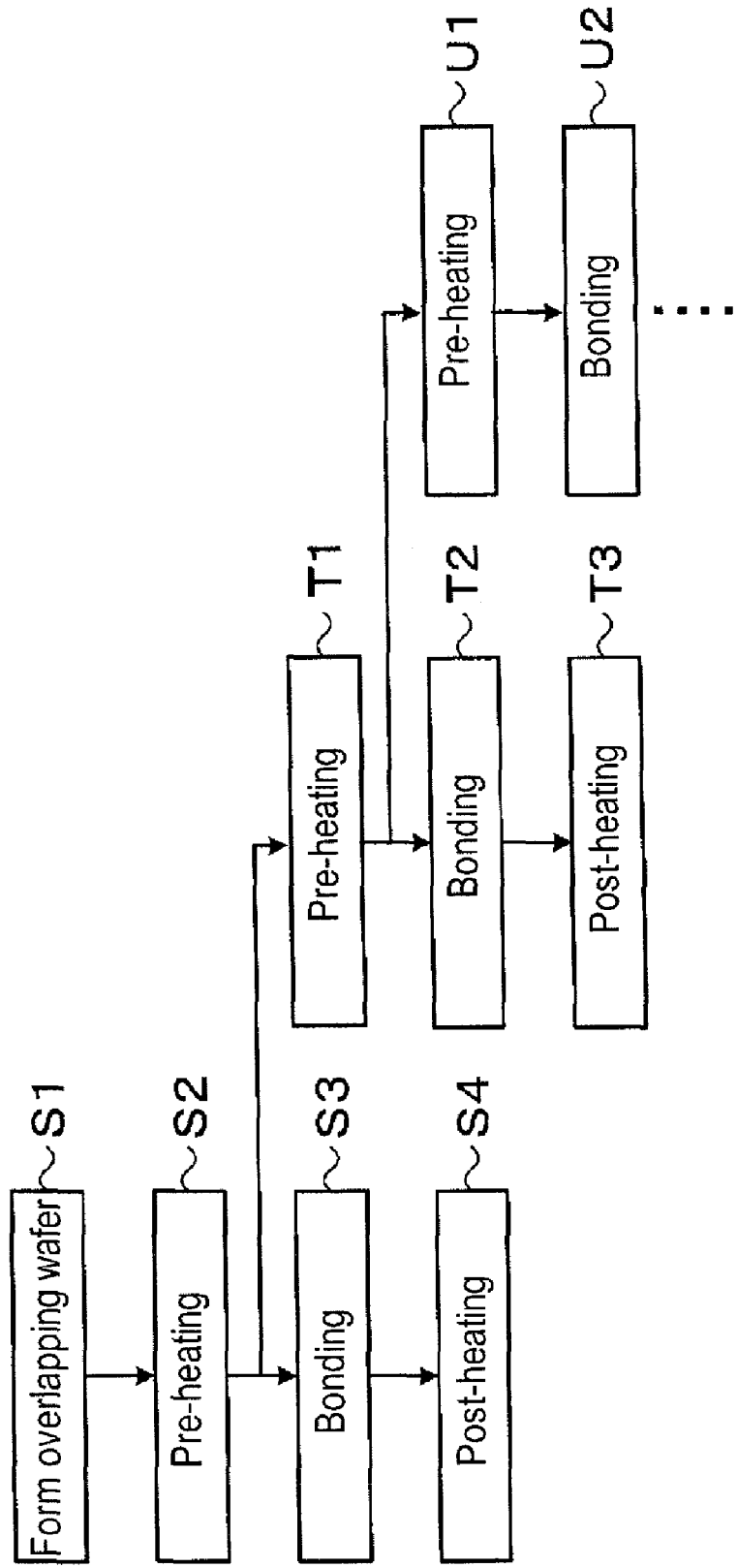
FIG. 20 is a flowchart illustrating major steps of a wafer bonding process.
Figure 21:
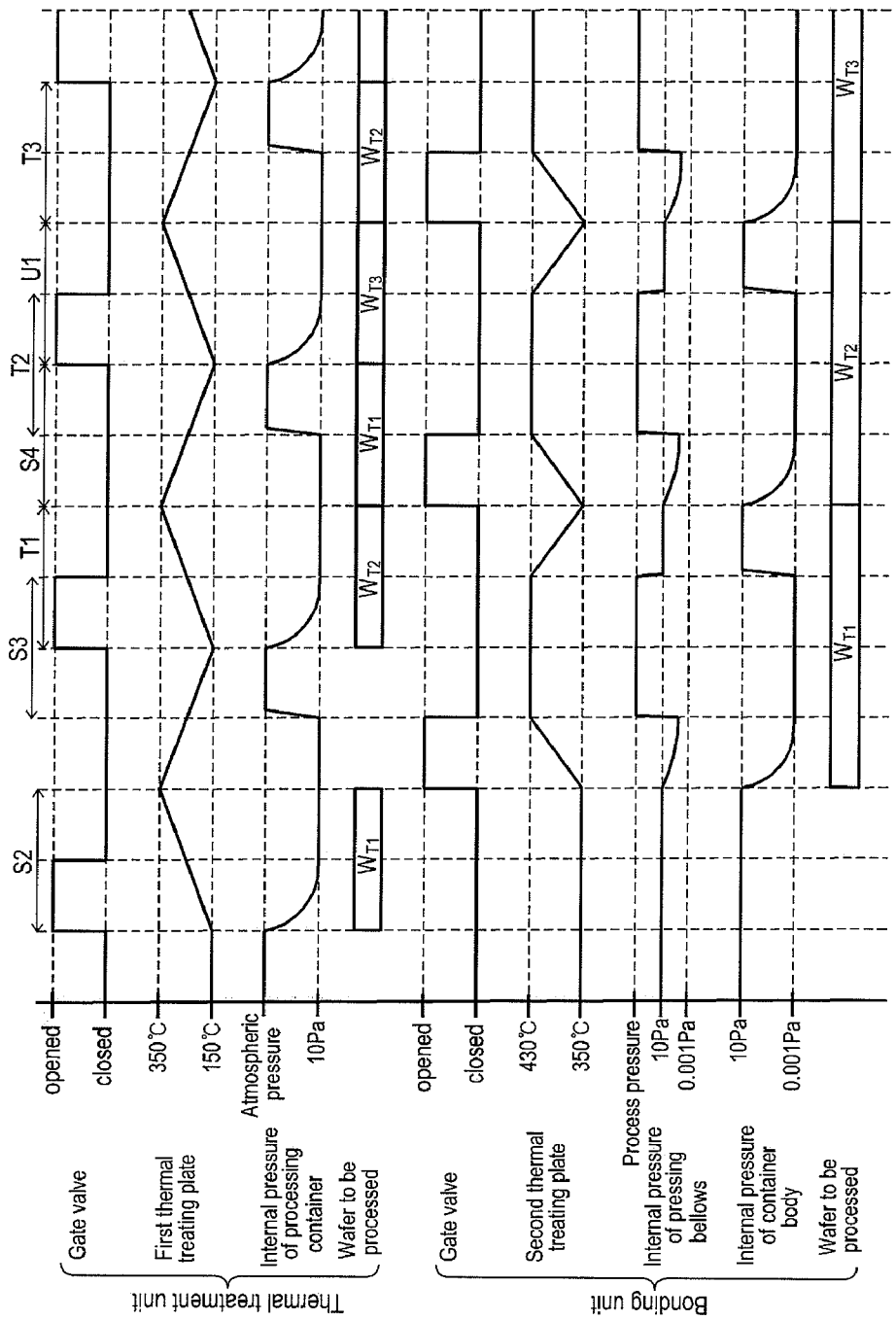
FIG. 21 is a time chart illustrating an operation state of each device of a bonding apparatus.

Next, a bonding process of the wafer $W_T$ to be performed using the above-configured bonding system 1 will be described. FIG. 20 is a flow chart showing main steps of the wafer bonding process and FIG. 21 is a time chart showing an operation state of each device of the bonding apparatus 10. FIG. 21 shows temporal changes in heating temperature of the wafer $W_T$, pressure of compressed air fed into the pressing bellows 83 of the pressing mechanism 80, in other words, load applied to the wafer $W_T$, pressure of the internal atmosphere of the thermal treatment unit 20, and pressure of the internal atmosphere of the bonding unit 21.

First, the upper wafer $W_U$ and the lower wafer $W_L$ are aligned and overlapped using an external alignment device (not shown). At this time, the adhesive 2 is pre-coated on one or both of the wafers $W_U$ and $W_L$ before being overlapped or superimposed, and they are temporarily bonded to form a wafer $W_{T1}$ (Step S1 in FIG. 20).

Thereafter, the wafer $W_{T1}$ is carried to the bonding apparatus 10 by means of a wafer carrying apparatus (not shown).

In the bonding apparatus 10, the gate valve 32 of the thermal treatment unit 20 is first opened and the wafer $W_{T1}$ is carried in the upper part of the first thermal treating plate 40 by means of the wafer carrying apparatus (not shown). Subsequently, the elevating pins 53 are elevated and the wafer $W_{T1}$ is passed from the wafer carrying apparatus (not shown) to the elevating pins 53. Then, the elevating pins 53 are lowered and the wafer $W_{T1}$ is mounted on the top of the carrying ring 60 previously mounted on the first thermal treating plate 40. Thereafter, the gate valve 32 is closed and the internal atmosphere of the processing container 30 is decompressed by the vacuum pump 35. Thereafter, the wafer $W_{T1}$ is heated to a first temperature, for example, 350 degrees Celsius by means of the first thermal treating plate 40 (Step S2 in FIGS. 20 and 21). At this time, the metal bonding portions $J_U$ and $J_L$ of the wafer $W_{T1}$ are uniformly heated at a predetermined rate of heating, for example, 10 to 50 degrees Celsius/min. At this time, in parallel to the heating by means of the first thermal treating plate 40, heating by means of the upper heating means 41 is performed. Accordingly, the heating is performed such that no difference in temperature occurs between the upper wafer $W_U$ and the lower wafer $W_L$ in the wafer $W_{T1}$. In addition, the internal pressure of the thermal treatment unit 20 is reduced to a predetermined degree of vacuum, for example, 10 Pa.

Once the wafer $W_{T1}$ is heated to the first temperature, the gate valve 22 is opened. Subsequently, the wafer $W_{T1}$ mounted on the first thermal treating plate 40 along with the carrying ring 60 is moved to the bonding unit 21 by means of the carrying mechanism 42 and is mounted on the second thermal treating plate 90 along with the carrying ring 60. Once the wafer $W_{T1}$ is mounted on the second thermal treating plate 90 along with the carrying ring 60, the carrying mechanism 42 is moved from the bonding unit 21 to the thermal treatment unit 20 and the gate valve 22 is closed.

Thereafter, the wafer $W_{T1}$ is heated to a second temperature, for example, 430 degrees Celsius by means of the second thermal treating plate 90. The wafer $W_{T1}$ is heated at a predetermined rate of heating, for example, 10 to 50 degrees Celsius/min. In addition, after the gate valve 22 is closed, the internal atmosphere of the processing container 70 is reduced to a predetermined degree of vacuum, for example, 0.001 Pa and is kept at that degree of vacuum. At this time, as the internal pressure of the processing container 70 becomes negative, a downward force is exerted on the top plate 72 due to a difference between a pressure applied to the top plate 72 and the internal pressure of the processing container 70, for example. This allows the shield bellows 73 to be contracted such that the pressing adapter 1 and the wafer $W_{T1}$ approach each other by a predetermined distance. In addition, as shown in FIG. 21, even before compressed air is fed into the pressing mechanism 80, specifically, the pressing bellows 83, under a state where the internal pressure of the processing container 70 is reduced, the internal pressure of the pressing mechanism 80 remains reduced to a predetermined pressure. This is to prevent a load from being applied to the wafer $W_{T1}$ at an unintended timing due to a difference between the internal pressure of the pressing mechanism 80 and the internal pressure of the processing container 70.

Thereafter, with the temperature of the wafer $W_{T1}$ kept at the second temperature, compressed air is fed to the pressing mechanism 80 to lower the pressing member 81. Accordingly, the lower adapter 85 of the pressing adapter 1 connected to the bottom of the pressing member 81 contacts the wafer $W_{T1}$ and the wafer $W_{T1}$ is pressed toward the second thermal treating plate 90 with a predetermined load, for example, 50 kN. When the wafer $W_{T1}$ is pressed for a predetermined period of time, for example, 10 minutes, the wafer $W_{T1}$ is bonded (Step S3 in FIGS. 20 and 21). At this time, since the internal atmosphere of the processing container is kept at the negative pressure, an atmosphere between the bonding portions $J_U$ and $J_L$ is suctioned, thereby preventing voids from being generated between the bonding portions $J_U$ and $J_L$. In addition, the temperature of the wafer $W_{T1}$ may be kept at the second temperature by additionally using a heater within the pressing member 81, or the cooling mechanism 100. In addition, by regulating the amount of compressed air fed into the pressing bellows 83, the temperature of the pressing member 81 may be adjusted to synchronize the temperature of the upper wafer $W_U$ with the temperature of the upper wafer $W_L$ in the wafer $W_{T1}$.

In parallel to the bonding of the wafer $W_{T1}$ in the bonding unit 21, a new wafer $W_{T2}$ is carried in the thermal treatment unit 20 by means of the wafer carrying apparatus (not shown) and is mounted on the first thermal treating plate 40. In carrying the wafer $W_{T2}$ in the thermal treatment unit 20, the thermal treating plate 40 is cooled to, for example, 150 degrees Celsius in order to make a difference in temperature between the thermal treating plate 40 and the wafer $W_{T2}$ smaller. Once the wafer $W_{T2}$ is mounted on the first thermal treating plate 40, the wafer $W_{T2}$ is heated to a first temperature, for example, 350 degrees Celsius by means of the first thermal treating plate 40 and the upper heating means 41 (Step T1 in FIGS. 20 and 21).

Thereafter, with the wafer $W_{T1}$ mounted on the second thermal treating plate 90, the wafer $W_{T1}$ is cooled to the first temperature, for example, 350 degrees Celsius. The wafer $W_{T1}$ is cooled at a predetermined rate of cooling, for example, 10 to 50 degrees Celsius/min in order to prevent change in strength and physical property of the bonding portions $J_U$ and $J_L$. The cooling of the wafer $W_{T1}$ is performed by elevating the cooling plate 110 of the cooling mechanism 100 and contacting the cooling plate 110 to the bottom of the second thermal treating plate 90.

Once the wafer $W_{T1}$ is cooled to 350 degrees Celsius, the wafer $W_{T2}$ mounted on the second thermal treating plate 90 and heated to 350 degrees Celsius is first held by the upper carrying mechanism 42a. Subsequently, the gate valve 22 is opened and the bonded wafer $W_{T1}$, along with the carrying ring 60, is carried from the second thermal treating plate 90 to the thermal treatment unit 20 by means of the lower carrying mechanism 42b. Subsequently, with the gate valve 22 opened, the wafer $W_{T2}$ held by the upper carrying mechanism 42a is carried to the bonding unit 21 and is mounted on the second thermal treating plate 90 along with the carrying ring 60. Subsequently, the upper carrying mechanism 42a is moved to the thermal treatment unit 20 and the gate valve 22 is closed. Thereafter, the wafer $W_{T2}$ is heated to the second temperature, for example, 430 degrees Celsius by means of the second thermal treating plate 90 and is pressed and bonded by means of the pressing member 80 and the pressing adapter 1 (Step T2 in FIGS. 20 and 21). In parallel to the pressing of the wafer $W_{T2}$, in the thermal treatment unit 20, the wafer $W_{T1}$ held by the upper carrying mechanism 42a is mounted on the first thermal treating plate 40 along with the carrying ring 60.

While the wafer $W_{T2}$ is being bonded in the bonding unit 21, the wafer $W_{T1}$ completed to be bonded in the bonding unit 21 and mounted on the first thermal treating plate 40 is cooled to a third temperature, for example, 150 degrees Celsius, by means of the first thermal treating plate 40 (Step S4 in FIGS. 20 and 21). At this time, a mixture of dry air and spray-shaped water is fed into the refrigerant passage 44 of the first thermal treating plate 40.

Thereafter, the thermal treatment unit 20 is opened to the atmospheric pressure, the elevating pins 53 are elevated, and the wafer $W_T$ is passed from the first thermal treating plate 40 to the elevating pins 53. Subsequently, the gate valve 32 is opened and the wafer $W_{T1}$ is passed from the elevating pins 53 to the wafer carrying apparatus (not shown) and is carried out of the bonding apparatus 10.

After the wafer $W_{T1}$ is carried out of the thermal treatment unit 20, subsequently, with the gate valve 32 opened, a new wafer $W_{T3}$ is passed to the elevating pins 53 and then is mounted on the first thermal treating plate 40. Then, the wafer $W_{T3}$ is heated to the first temperature, for example, 350 degrees Celsius, by means of the first thermal treating plate 40 and the upper heating means 41 (Step U1 in FIGS. 20 and 21).

Upon completion of the bonding of the wafer $W_{T2}$ in the bonding unit 21, the wafer $W_{T2}$ is cooled to 350 degrees Celsius while being mounted on the second thermal treating plate 90, like the wafer $W_{T1}$. Subsequently, the wafer $W_{T3}$ mounted on the second thermal treating plate 90 and heated to 350 degrees Celsius is held by the upper carrying mechanism 42a. Thereafter, the gate valve 22 is opened and the wafer $W_{T2}$ is carried out of the bonding unit 21 by means of the lower carrying mechanism 42b. Subsequently, with the gate valve 22 opened, the wafer $W_{T3}$ held by the upper carrying mechanism 42a is carried in the bonding unit 21 and is mounted on the second thermal treating plate 90. Once the wafer $W_{T3}$ is mounted on the second thermal treating plate 90 of the bonding unit 21, the upper carrying mechanism 42a is moved to the thermal treatment unit 20 and the gate valve 22 is closed. Thereafter, the wafer $W_{T3}$ is pressed and bonded by the pressing adapter 1 (Step U2 in FIGS. 20 and 21).

While the wafer $W_{T3}$ is being bonded in the bonding unit 21, the wafer $W_{T2}$ mounted on the first thermal treating plate 40 is cooled to the third temperature, for example, 150 degrees Celsius, by means of the first thermal treating plate 40 (Step T3 in FIGS. 20 and 21). Subsequently, the thermal treatment unit 20 is opened to atmospheric pressure, the elevating pins 53 are elevated, and the wafer $W_{T2}$ is passed from the first thermal treating plate 40 to the elevating pins 53. Subsequently, the gate valve 32 is opened, the wafer $W_{T2}$ is passed from the elevating pins 53 to the wafer carrying apparatus (not shown) and the wafer $W_{T2}$ is carried out of the bonding apparatus 10. Thereafter, subsequently, with the gate valve 32 opened, a new wafer $W_{T4}$ is passed to the elevating pins 53 and then is mounted on the first thermal treating plate 40. Thus, a series of bonding processes of a plurality of wafers $W_T$ continues to be performed in the single bonding apparatus 10.

With the embodiment described above, the thermal treating unit 20 and the bonding unit 21 are provided independently of each other. It is therefore possible to process the wafers $W_T$ one after another in the thermal treating unit 20 and the bonding unit 21. In other words, the wafer $W_T$ is first placed on the first thermal treating plate 40 and heated in the thermal treating unit 20. Within the bonding unit 21 in which the atmosphere is kept at a specified degree of vacuum, the wafer $W_T$ is placed on the second thermal treating plate 90. While keeping the wafer $W_T$ at a specified temperature, the wafer $W_T$ is pressed against the second thermal treating plate 90 and is bonded together. Thereafter, the wafer $W_T$ is placed on the first thermal treating plate 40 in the thermal treating unit 20 and is cooled by supplying a coolant to the coolant flow path 44 as a cooling mechanism. It is therefore possible to parallel process another wafer $W_T$ in the thermal treating unit 20 while one wafer $W_T$ is processed in the bonding unit 21. With the present disclosure, two wafers $W_T$ can be efficiently processed despite the fact that the specified temperature is high. This is because the thermal treating unit 20 and the bonding unit 21 are provided independently of each other. Accordingly, it is possible to increase the throughput of the substrate bonding process.

The heater 81a is installed within the pressing member 81 of the pressing mechanism 80, and the cooling mechanism 100 is provided in the bonding unit 21. In steps S3, since T2 and U2 are performed in the bonding unit 21, it is possible to finely control the temperature of the wafer $W_T$ and to reliably keep the temperature of the wafer $W_T$ at the second temperature. It is also possible to rapidly perform the heating and cooling of the wafer $W_T$.

Since the heater 43 for heating the wafer $W_T$ and the pair of coolant flow paths 44 as the cooling mechanism are provided in the first thermal treating plate 40 of the thermal treating unit 20, it is possible to finely adjust the temperature of the wafer $W_T$ in steps S4 and T3 performed in the thermal treating unit 20 and to keep the cooling speed of the wafer $W_T$ at a specified cooling speed. Accordingly, it is possible to prevent an occurrence of changes in the strength and physical properties of the bonding portions $J_U$ and $J_L$ of the wafer $W_T$. Inasmuch as the heater 43 and the coolant flow path 44 are provided in the first thermal treating plate 40 of the thermal treating unit 20, there is no need to provide two cooling and thermal treating units in the bonding apparatus 10. This makes it possible to reduce the installation cost of the bonding apparatus 10 and to minimize the installation area of the bonding apparatus 10.

Although in the above embodiment the bonding portions $J_U$ and $J_L$ are made of aluminum and germanium, respectively, they may be made of different metal. In this case, the processing conditions in the bonding unit 21, such as heating temperature and pressing load of the wafer $W_T$, depend on the type of metal used for the bonding portions $J_U$ and $J_L$. In addition, although in the above embodiment the metal bonding portions $J_U$ and $J_L$ are provided in the wafers $W_U$ and $W_L$, the present disclosure may be applied to other various substrates including a metal substrate, a flat panel display (FPD), a mask reticle for a photomask and so on.

While certain preferred embodiments have been described above with reference to the accompanying drawings, the present disclosure is not limited thereto. It will be apparent to those skilled in the art that many different modifications and changes may be made without departing from the scope and spirit of the present disclosure defined in the claims. It goes without saying that such modifications and changes should be construed to fall within the technical scope of the present disclosure.

The present disclosure is useful in bonding substrates having metallic bonding portions.

According to the present disclosure, it is possible to efficiently bond individual substrates having metallic bonding portions and to increase the throughput of the substrate bonding process.

While certain embodiments have been described, these embodiments have been presented by way of example only, and are not intended to limit the scope of the disclosures. Indeed, the novel apparatus and method described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bonding apparatus for bonding individual substrates having metallic bonding portions, comprising:
   a thermal treating unit including a first thermal treating plate configured to support and thermally process a superimposed substrate obtained by superimposing the individual substrates with the bonding portions thereof kept in alignment with each other and a first depressurizing mechanism configured to depressurize the atmosphere within the thermal treating unit to a specified degree of vacuum; and
   a bonding unit including a second thermal treating plate configured to support and thermally process the superimposed substrate processed in the thermal treating unit, a pressing mechanism configured to press the superimposed substrate against the second thermal treating plate, and a second depressurizing mechanism configured to depressurize the atmosphere within the bonding unit to a specified degree of vacuum, wherein the thermal treating unit is air-tightly connected to the bonding unit, and the first thermal treating plate includes a cooling mechanism configured to cool the superimposed substrate placed on the first thermal treating plate.

2. The apparatus of claim 1, wherein the thermal treating unit includes a plurality of carrying mechanisms configured to convey the superimposed substrate between the thermal treating unit and the bonding unit.

3. The apparatus of claim 1, wherein the bonding unit includes a cooling mechanism configured to cool the superimposed substrate placed on the second thermal treating plate.

4. A bonding method for bonding individual substrates having metallic bonding portions, comprising:

placing a first superimposed substrate on a first thermal treating plate in a thermal treating unit and heating the first superimposed substrate to a first temperature, wherein the first superimposed substrate is obtained by superimposing the individual substrates with the bonding portions thereof kept in contact with each other;

placing the first superimposed substrate on a second thermal treating plate in a bonding unit in which the atmosphere is depressurized to a specified degree of vacuum, and bonding the first superimposed substrate by pressing the first superimposed substrate against the second thermal treating plate while keeping the first superimposed substrate at a second temperature higher than the first temperature;

cooling the bonded first superimposed substrate placed on the second thermal treating plate to the first temperature; and placing the bonded first superimposed substrate on the first thermal treating plate in the thermal treating unit and cooling the bonded first superimposed substrate to a third temperature which is lower than the first temperature, wherein the first superimposed substrate in the bonding unit is being bonded, either heating a second superimposed substrate to the first temperature or cooling a third superimposed substrate to the third temperature in the thermal treating unit.

* * * * *